(12) United States Patent
Kobayashi et al.

(10) Patent No.: US 12,652,961 B2
(45) Date of Patent: Jun. 9, 2026

(54) PIEZOELECTRIC LAMINATE AND PIEZOELECTRIC ELEMENT

(71) Applicant: FUJIFILM Corporation, Tokyo (JP)

(72) Inventors: Hiroyuki Kobayashi, Kanagawa (JP); Seigo Nakamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 937 days.

(21) Appl. No.: 17/898,688

(22) Filed: Aug. 30, 2022

(65) Prior Publication Data

US 2023/0095101 A1　　Mar. 30, 2023

(30) Foreign Application Priority Data

Sep. 27, 2021　　(JP) ................................. 2021-157102

(51) Int. Cl.
　　*H01L 41/18*　　(2006.01)
　　*H10N 30/50*　　(2023.01)
　　*H10N 30/85*　　(2023.01)
　　*H10N 30/87*　　(2023.01)

(52) U.S. Cl.
　　CPC .............. *H10N 30/85* (2023.02); *H10N 30/50* (2023.02); *H10N 30/877* (2023.02)

(58) Field of Classification Search
　　CPC ....... H10N 30/85; H10N 30/50; H10N 30/877
　　See application file for complete search history.

(56) References Cited

U.S. PATENT DOCUMENTS

2004/0113189 A1　6/2004　Takamatsu et al.
2005/0168112 A1　8/2005　Aoki et al.

2007/0040198 A1　2/2007　Matsuura
2009/0066763 A1　3/2009　Fujii et al.
2010/0213795 A1　8/2010　Li et al.
2011/0215679 A1　9/2011　Naono
2017/0186936 A1　6/2017　Fujii et al.
2018/0138393 A1　5/2018　Sumi et al.
(Continued)

FOREIGN PATENT DOCUMENTS

EP　　1 560 278 A1　　8/2005
JP　　2004-6593 A　　1/2004
(Continued)

OTHER PUBLICATIONS

European Communication pursuant to Article 94(3) EPC for corresponding European Application No. 22191046.6, dated Nov. 15, 2023.
(Continued)

*Primary Examiner* — Bryan P Gordon
(74) *Attorney, Agent, or Firm* — Birch, Stewart, Kolasch & Birch, LLP

(57) ABSTRACT

A piezoelectric laminate and a piezoelectric element have, on a substrate in the following order, a lower electrode layer, and a piezoelectric film containing a perovskite-type oxide. The lower electrode layer includes a first layer arranged in a state of being in contact with the substrate and includes a second layer arranged in a state of being in contact with the piezoelectric film, the first layer contains Ti or TiW as a main component, the second layer is a uniaxial alignment film which contains Ir as a main component and in which the Ir is aligned in a (111) plane, and a half width at half maximum of an X-ray diffraction peak from the (111) plane is 0.3° or more.

12 Claims, 9 Drawing Sheets

(56) References Cited

U.S. PATENT DOCUMENTS

| | | | | |
|---|---|---|---|---|
| 2018/0159019 A1* | 6/2018 | Nanao | ................... | H10N 30/302 |
| 2020/0176667 A1* | 6/2020 | Kimura | ................ | H10N 30/076 |
| 2020/0307216 A1* | 10/2020 | Koike | .................. | B41J 2/14233 |

FOREIGN PATENT DOCUMENTS

| | | | |
|---|---|---|---|
| JP | 2004-153019 A | 5/2004 | |
| JP | 2005-223318 A | 8/2005 | |
| JP | 2007-81378 A | 3/2007 | |
| JP | 2009-70955 A | 4/2009 | |
| JP | 2010-56126 A | 3/2010 | |
| JP | 2010-56426 A | 3/2010 | |
| JP | 2011-181828 A | 9/2011 | |
| JP | 2012-519378 A | 8/2012 | |
| JP | 2018-82052 A | 5/2018 | |
| JP | 2018-93145 A | 6/2018 | |
| WO | WO 2016/051644 A1 | 4/2016 | |

OTHER PUBLICATIONS

Japanese Office Action for corresponding Japanese Application No. 2021-157102, dated Nov. 26, 2024, with an English translation.
Extended European Search Report for European Application No. 22191046.6, dated Feb. 21, 2023.

* cited by examiner

[COMPARATIVE EXAMPLE 1]

PIEZOELECTRIC LAMINATE AND PIEZOELECTRIC ELEMENT

CROSS REFERENCE TO RELATED APPLICATIONS

The present application claims priority under 35 U.S.C. § 119 to Japanese Patent Application No. 2021-157102 filed on Sep. 27, 2021. The above application is hereby expressly incorporated by reference, in its entirety, into the present application.

BACKGROUND OF THE INVENTION

1. Field of the Invention

The present disclosure relates to a piezoelectric laminate and a piezoelectric element.

2. Description of the Related Art

As a material having excellent piezoelectric characteristics and excellent ferroelectricity, there is known a perovskite-type oxide such as lead zirconate titanate (Pb(Zr,Ti)O$_3$, hereinafter referred to as PZT). A piezoelectric body consisting of a perovskite-type oxide is applied as a piezoelectric film in a piezoelectric element having a lower electrode, a piezoelectric film, and an upper electrode on a substrate. This piezoelectric element has been developed into various devices such as a memory, an inkjet head (an actuator), a micromirror device, an angular velocity sensor, a gyro sensor, a piezoelectric micromachined ultrasonic transducer (PMUT), and an oscillation power generation device.

In a case of applying a piezoelectric element to a device, it is desirable that the piezoelectric element has high piezoelectric characteristics because higher piezoelectric characteristics lead to power saving. So far, for the improvement of the piezoelectric characteristics, a method such as improving the crystallinity of the piezoelectric film or reducing the resistance of the electrode layer has been studied.

As the lower electrode layer of the piezoelectric element, an Ir layer is used in a large number of cases from the viewpoint of the adhesiveness to the piezoelectric film and the reduction of the resistance. It is noted that, for the reduction of the resistance, the Ir layer is generally made to have a thickness of 150 nm or more. Further, although the Ir layer has good adhesiveness to the piezoelectric film, it does not have good adhesiveness to the silicon substrate, and thus in a large number of cases, an intimate attachment layer consisting of a TiW layer or a Ti layer is provided between the Ir layer and the substrate (WO2016/051644A and JP2009-70955A).

JP2010-056426A proposes a laminated structure in which an Ir layer and an Au layer are laminated for more reduction of the resistance of the lower electrode layer. In a case of using Au, which has higher conductivity than Ir, it is possible to realize the reduction of the resistance of the entire lower electrode layer.

On the other hand, in a case where a piezoelectric film containing a perovskite-type oxide as a main component is formed on an Ir layer, there is a problem that a pyrochlore phase, which is a different phase, is easily formed at the interface between the piezoelectric film and the lower electrode layer. The pyrochlore phase is paraelectric, and thus the decrease in the dielectric constant and the deterioration of the piezoelectric characteristics occur in a case where the pyrochlore phase is formed. Further, in a piezoelectric element including a pyrochlore phase at the interface between the piezoelectric film and the lower electrode layer, peeling or the like occurs easily, and thus the low long-term reliability is low as compared with a piezoelectric element in which the pyrochlore phase is suppressed.

JP2018-82052A proposes providing an alignment control layer (a seed layer) on the lower electrode layer as a method of suppressing the formation of the pyrochlore phase and improving the crystallinity of the piezoelectric film.

SUMMARY OF THE INVENTION

The lower electrode materials (specifically, Ir and, Ti or TiW) disclosed in WO2016/051644A, JP2009-70955A, and the like and currently widely used in actual devices are materials that have been narrowed down based on the past achievements. The lower electrode materials that have been used in the related art have a good interfacial reaction with piezoelectric materials and are excellent in long-term durability (stability) as compared with other materials, and thus there is a strong demand to avoid changing these lower electrode materials. On the other hand, further improvement in the long-term reliability of the piezoelectric element is also desired.

As in JP2010-056426A, in a case where an Au layer is provided in the lower electrode layer, the reduction of the resistance can be realized. On the other hand, it has been found that in a case where an Au layer is provided in the lower electrode layer, the long-term reliability decreases as compared with a case of the laminated structure of the Ir layer and the TiW or Ti intimate attachment layer, which is disclosed in WO2016/051644A and JP2009-70955A. It is conceived that this is because the diffusion of Au occurs due to carrying out the high temperature film formation in a case of forming a piezoelectric film according to a sputter film formation on the lower electrode layer. Due to having a relatively low melting point, it is presumed that Au diffuses into the piezoelectric film at the time of the formation of the piezoelectric film, and thus leaking easily occurs.

JP2018-82052A improves the crystallinity of the piezoelectric film by providing an alignment control layer to achieve piezoelectric characteristics and long-term stability. However, since a novel layer called an alignment control layer is introduced separately from the piezoelectric film and the electrode, there is a problem that the load in the manufacturing process is large.

The technique of the present disclosure has been made in consideration of the above circumstances, and an object of the present disclosure is to provide a piezoelectric laminate and a piezoelectric element, having improved piezoelectric characteristics and drive stability without increasing the process load.

Specific means for solving the above problems include the following aspects.

The piezoelectric laminate of the present disclosure is piezoelectric laminate comprising, on a substrate in the following order:

a lower electrode layer; and a piezoelectric film containing a perovskite-type oxide, in which the lower electrode layer includes a first layer arranged in a state of being in contact with the substrate and includes a second layer arranged in a state of being in contact with the piezoelectric film, the first layer contains Ti or TiW as a main component, the second layer is a uniaxial alignment film which contains Ir as a main component and in which the Ir is aligned in a (111) plane, and a half width at half maximum of an X-ray diffraction peak from the (111) plane is 0.3° or more.

In the piezoelectric laminate of the present disclosure, it is preferable that the half width at half maximum of the X-ray diffraction peak from the (111) plane is 0.35° or more.

In the piezoelectric laminate of the present disclosure, it is preferable that in the second layer, the (111) plane of Ir has an inclination of 1° or more with respect to a thickness direction.

In the piezoelectric laminate of the present disclosure, it is preferable that the thickness of the second layer is 50 nm or less.

In the piezoelectric laminate of the present disclosure, it is preferable that the thickness of the lower electrode layer is 200 nm or more.

In the piezoelectric laminate of the present disclosure, it is preferable that a sheet resistance of the lower electrode layer is preferably 1 Ω/sq or less.

In the piezoelectric laminate of the present disclosure, it is preferable that a height difference of a surface unevenness of the piezoelectric film is 100 nm or less.

In the piezoelectric laminate of the present disclosure, it is preferable that the perovskite-type oxide contains Pb, Zr, Ti, and O.

Still higher piezoelectric characteristics can be obtained particularly in a case where the perovskite-type oxide is a compound represented by General Formula (1), $$Pb\{(Zr_xTi_{1-x})_{1-y}B1_y\}O_3 \quad\quad (1)$$

where $0<x<1$ and $0<y<0.4$ are satisfied, and

B1 is one or more elements selected from V, Nb, Ta, Sb, Mo, and W.

In the piezoelectric laminate of the present disclosure, it is preferable that the piezoelectric film has a columnar structure consisting of a large number of columnar crystals.

In the piezoelectric laminate of the present disclosure, it is preferable that a (100) or (001) plane of the columnar crystals has an inclination of 1° or more with respect to a surface of the substrate.

The piezoelectric element of the present disclosure has the piezoelectric laminate of the present disclosure and an upper electrode layer provided on the piezoelectric film of the piezoelectric laminate.

According to the piezoelectric laminate and the piezoelectric element of the present disclosure, it is possible to improve piezoelectric characteristics and the drive stability without increasing the process load.

DESCRIPTION OF THE PREFERRED EMBODIMENTS

Figure 1:
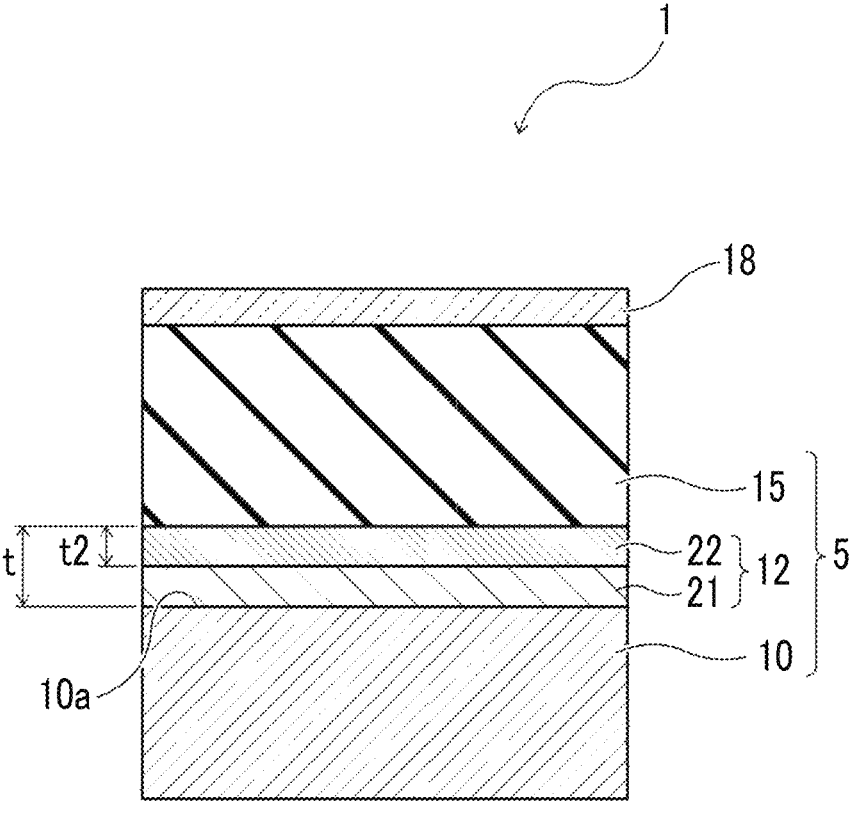
FIG. 1 is a cross-sectional view illustrating a layer configuration of a piezoelectric element according to one embodiment.

Hereinafter, embodiments of the present invention will be described with reference to the drawings. In the drawings below, the layer thickness of each of the layers and the ratio therebetween are appropriately changed and drawn for easy visibility, and thus they do not necessarily reflect the actual layer thickness and ratio.

Piezoelectric Laminate 5 and Piezoelectric Element 1, According to First Embodiment FIG. 1 is a cross-sectional view illustrating layer configurations of a piezoelectric laminate 5 and a piezoelectric element 1 having the piezoelectric laminate 5, according to a first embodiment. As illustrated in FIG. 1, the piezoelectric element 1 has the piezoelectric laminate 5 and an upper electrode layer 18. The piezoelectric laminate 5 has a substrate 10 and a piezoelectric film 15 laminated on the substrate 10, where the piezoelectric film 15 includes a lower electrode layer 12 and contains a perovskite-type oxide. Here, "lower" and "upper" do not respectively mean top and bottom in the vertical direction. As result, an electrode arranged on the side of the substrate 10 with the piezoelectric film 15 being interposed is merely referred to as the lower electrode layer 12, and an electrode arranged on the side of the piezoelectric film 15 opposite to the substrate 10 is merely referred to as the upper electrode layer 18.

In the piezoelectric laminate 5 and the piezoelectric element 1 according to the present embodiment, the lower electrode layer 12 includes a first layer 21 arranged in a state of being in contact with the substrate 10 and includes a second layer 22 arranged in a state of being in contact with the piezoelectric film 15. The first layer 21 is a layer containing titanium (Ti) or a titanium-tungsten alloy (TiW) as a main component. In the present specification, "the main component" refers to a component that occupies 90 at % or more of the constituent elements. In a case where TiW is contained as the main component, the total of the Ti content and the W content may be 90 at % or more.

The second layer 22 is a layer containing Ir as a main component, and in the following description, the second layer 22 may be referred to as an Ir layer 22. The half width at half maximum of an X-ray diffraction peak (hereinafter, referred to as an Ir (111) peak) from the (111) plane in the Ir layer 22 is 0.3° or more. The half width at half maximum of the Ir (111) peak is preferably 0.35° or more. The wider half width at half maximum of the Ir (111) peak means that the lower the crystallinity is, and the wider the half width is, the more the pyrochlore phase tends to be suppressed. On the other hand, in order to further reduce the crystallinity of the Ir layer 22, it is required to carry out a treatment such as the addition of an impurity element, and thus there is a concern that the adhesiveness to the piezoelectric film or the like may be reduced due to the addition of the impurity element or the like. At present, the half width of the Ir (111) peak is preferably 0.45° or less and more preferably 0.4° or less.

Here, the half width at half maximum of the Ir (111) peak shall be measured as follows. The upper electrode layer 18 of the piezoelectric element is removed, and an XRD chart according to the X-ray diffraction (XRD) of a thin film is acquired in a state where the lower electrode layer 12 and the piezoelectric film 15 are provided on the substrate 10. The Ir (111) peak in the XRD chart is subjected to fitting with a predetermined function. The Ir (111) peak appears in the vicinity of 2θ=40.7°. The half width at half maximum is determined as an interval between a 2θ value at which the maximum value of a peak is shown and a 2θ value at which the half value of the maximum value is obtained and which is on a side where the peak of the maximum value does not overlap with the other peaks (see FIG. 8).

In a case where a film of Ir is formed on a substrate according to sputtering, Ir is preferentially aligned in the (111) plane to form a natural alignment film. Crystallinity is associated with the half width at half maximum of the Ir (111) peak in the XRD chart (see FIG. 8) that is obtained by the XRD diffraction method. The wider the half width at half maximum of the Ir (111) peak is, the lower the crystallinity is, and the narrower the half width is, the higher the crystallinity is. In a case where the half width at half maximum is 0.3° or more, the alignment state of the (111) plane in the Ir layer 22 is disturbed, and thus the crystallinity is slightly low.

Further, in the present embodiment, the (111) plane in the Ir layer 22 has an inclination of 1° or more with respect to the thickness direction.

Figure 2:
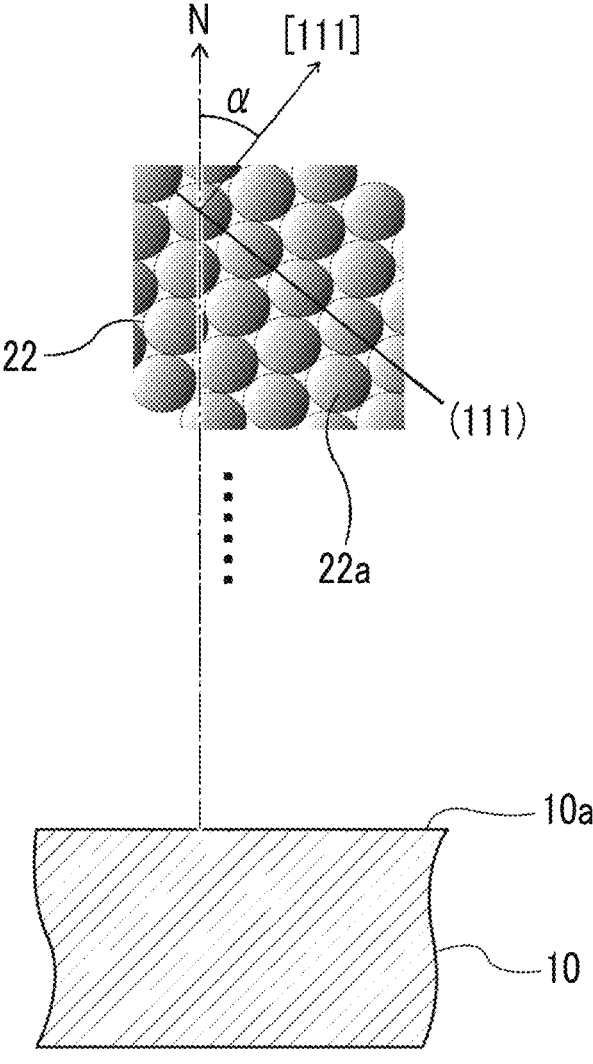
FIG. 2 is an explanatory view of an alignment state of a second layer (an Ir layer) of a lower electrode layer in the present embodiment.

FIG. 2 is a view schematically illustrating the Ir layer 22 according to the present embodiment, and particles 22a in the figure indicate the Ir element. As illustrated in FIG. 2, being inclined by 1° or more with respect to the thickness direction of the (111) plane means that an inclination α with respect to a thickness direction N, in a direction [111] perpendicular to the (111) plane, is 1° or more. Here, the thickness direction N is the thickness direction of the Ir layer, and it is a direction perpendicular to a surface 10a of the substrate 10. The actual Ir layer 22 contains a large number of crystals, and the inclination directions of the (111) planes of the individual crystals are various. In the present specification, the inclination a of the (111) plane in the Ir layer 22 is defined by a value measured by a locking curve measurement by X-ray diffraction. Specifically, the inclination a of the (111) plane is calculated from the split width of the (111) diffraction peak in the locking curve measurement data (see Examples).

Figure 3:
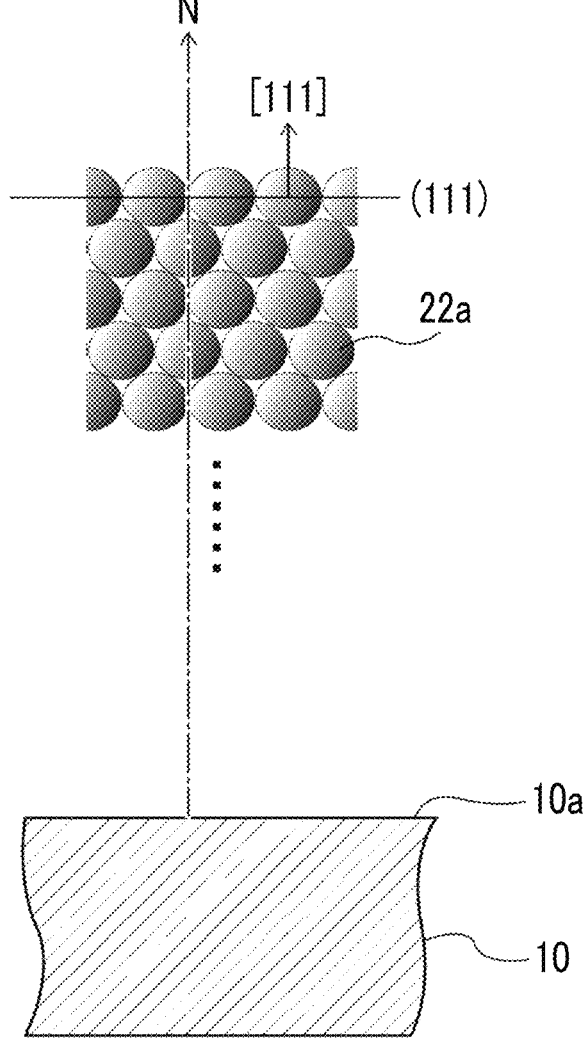
FIG. 3 is an explanatory view of an alignment state of the Ir layer that is used as a lower electrode layer in the piezoelectric element in the related art.

The (111) plane is the preferential alignment plane of Jr, and in the related art, an Ir layer, in which Jr is aligned so that the (111) plane is perpendicular to the thickness direction, that is, the [111] direction coincides with the thickness direction N as illustrated in FIG. 3, has been used as the lower electrode layer. In a case where a piezoelectric film made of a perovskite-type oxide is formed on an Ir layer having high crystallinity as illustrated in FIG. 3, a pyrochlore phase is easily formed at the initial stage of film formation. On the other hand, the inventors of the present invention found that in a case of reducing the crystallinity of the Ir layer 22, it is possible to suppress the growth of the pyrochlore phase (see Examples).

The Jr (111) plane preferably has an inclination a of 1° or more and 15° or less and more preferably has an inclination of 1° or more and 8° or less with respect to the thickness direction N.

It is noted that the larger the inclination a of the (111) plane in the first layer 21 with respect to the thickness direction N is, the higher the effect of suppressing the growth of the pyrochlore phase, which is preferable. On the other hand, in a case of setting the inclination to 15° or less, it is possible to suppress an occurrence that another alignment plane becomes the preferential alignment plane, which is preferable.

Regarding the second layer 22, that is, the Ir layer 22, the thickness t2 is preferably 50 nm or less. The thickness t2 is more preferably less than 50 nm and still more preferably 45 nm or less. Further, from the viewpoint that it can be formed into a uniform film shape, the thickness t2 is preferably 10 nm or more.

The thickness t of the entire lower electrode layer 12 is preferably 200 nm or more and more preferably 250 nm or more. In addition, the thickness t is preferably 500 nm or less and more preferably 400 nm or less.

The thickness t of the lower electrode layer 12 and the thickness t2 of the Ir layer 22 can be estimated from a scanning electron microscope (SEM) image of a cross section of a piezoelectric element, a transmission electron microscope (TEM) image, or a secondary ion mass spectrometry (SIMS) analysis.

The sheet resistance of the lower electrode layer 12 is preferably 1 Ω/sq or less and more preferably 0.8 Ω/sq or less. The sheet resistance can be measured according to the four-point probe method by using a resistivity meter.

The piezoelectric film 15 contains a perovskite-type oxide represented by the general formula $ABO_3$.

In the general formula, A is an A-site element, which is one of Pb, barium (Ba), lanthanum (La), Sr, bismuth (Bi), lithium (Li), sodium (Na), calcium (Ca), cadmium (Cd), magnesium (Mg), or potassium (K), or a combination of two or more thereof.

In the general formula, B is a B-site element, which is one of Ti, Zr, vanadium (V), Nb (niobium), tantalum (Ta), chromium (Cr), molybdenum (Mo), tungsten (W), manganese (Mn), iron (Fe), Ru, cobalt (Co), Ir, nickel (Ni), copper (Cu), zinc (Zn), gallium (Ga), In, tin, antimony (Sb), or a lanthanide element, or a combination of two or more thereof.

In the general formula, O is oxygen.

Regarding A:B:O, a reference ratio is 1:1:3; however, it suffices that the ratio is in a range in which a perovskite structure is obtained.

It is noted that the perovskite-type oxide preferably occupies 80% by mole or more of the piezoelectric film 15, and the perovskite-type oxide more preferably occupies 90% by mole or more thereof. Further, it is preferable that the piezoelectric film 15 is consisting of a perovskite-type oxide (however, it contains unavoidable impurities).

The perovskite-type oxide is preferably a lead zirconate titanate (PZT) type that contains lead (Pb), zirconium (Zr), titanium (Ti), and oxygen (O).

In particular, it is preferable that the perovskite-type oxide is a compound represented by General Formula (1), which contains an additive B in the B site of PZT.

$$Pb\{(Zr_xTi_{1-x})_{1-y}B1_y\}O_3 \qquad (1)$$

Here, B1 is preferably one or more elements selected from vanadium (V), niobium (Nb), tantalum (Ta), Sb (antimony), molybdenum (Mo), and tungsten (W). It is most preferable that B1 is Nb. Here, $0<x<1$ and $0<y<0.4$ are satisfied. It is noted that regarding Pb: $\{(Zr_xTi_{1-x})_{1-y}B_y\}$:O in General Formula (1), a reference ratio thereof is 1:1:3; however, it suffices that the ratio is in a range in which a perovskite structure is obtained.

B1 may be a single element such as V only or Nb only, or it may be a combination of two or three or more elements, such as a mixture of V and Nb or a mixture of V, Nb, and Ta. In a case where B1 is these elements, a very high piezoelectric constant can be realized in combination with Pb of the A-site element.

Figure 4:
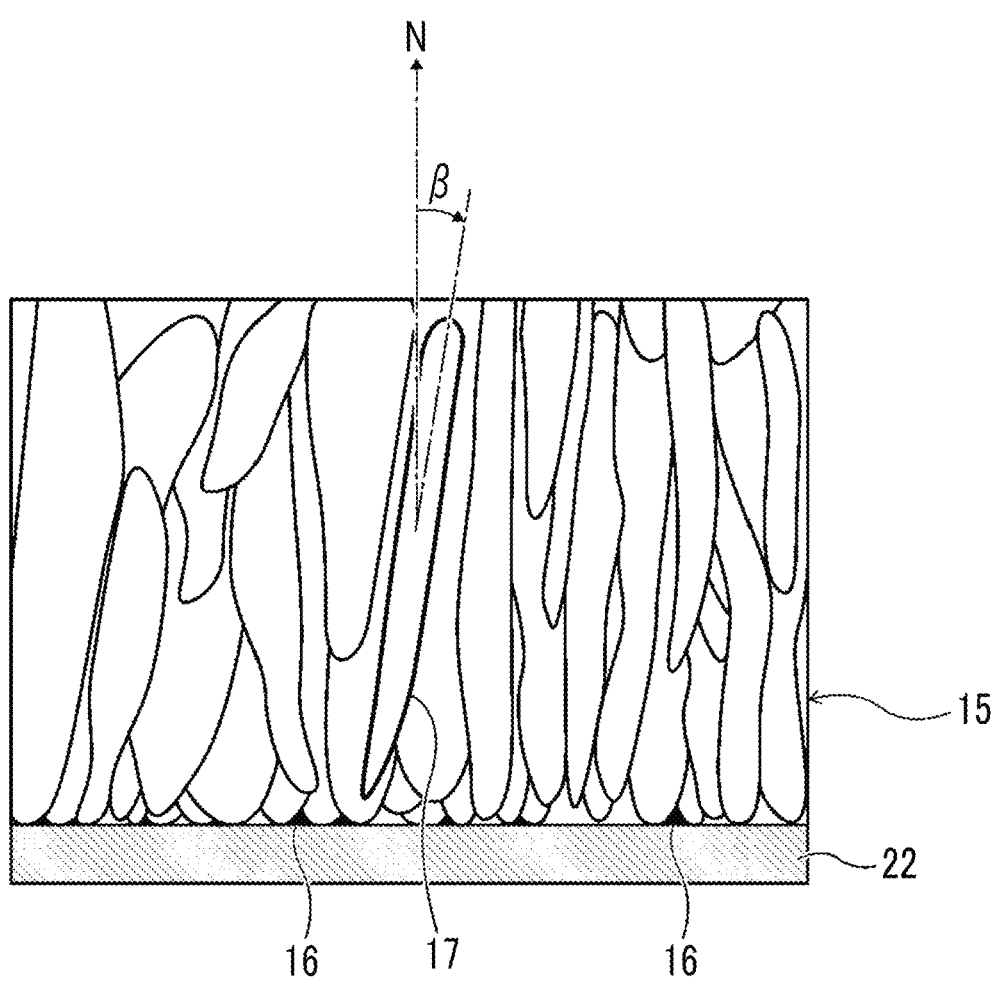
FIG. 4 is an enlarged schematic view of a piezoelectric film.

As illustrated in the schematic cross-sectional view of FIG. 4, the piezoelectric film 15 is preferably a columnar structure film having a columnar structure containing a large number of columnar crystal bodies 17. It is preferable that a large number of columnar crystal bodies 17 are uniaxial alignment films that extend non-parallelly with respect to the surface of the substrate 10 (see FIG. 1) and have the same crystal orientation. In a case of adopting an alignment structure, it is possible to obtain larger piezoelectricity. It is noted that the piezoelectric film 15 includes a pyrochlore phase 16 at the interface between the piezoelectric film 15 and the second layer 22 of the lower electrode layer 12. Although details will be described later, the pyrochlore phase 16 is in a state of being sufficiently suppressed. The pyrochlore phase 16 preferably has a thickness of 20 nm or less. It is noted that the pyrochlore phase 16 is not uniformly formed on the surface of the lower electrode layer 12 but is partially grown as illustrated in FIG. 4. The method of calculating the thickness of the pyrochlore phase 16 will be described in Examples.

Further, in the example illustrated in FIG. 4, the longitudinal direction of the columnar crystal has an inclination $\beta$ of 1° or more with respect to the normal line of the substrate (the thickness direction N). This means that the alignment plane of the piezoelectric film 15 has an inclination of 1° or more with respect to the surface of the substrate. Here, the alignment plane is a (100) plane or a (001) plane. As described above, it is preferable that in the piezoelectric film 15, the (100) plane or (001) plane of the columnar crystals is inclined by 1° or more with respect to the surface of the substrate. In this example, the lattice constants of the a-axis and the c-axis in the perovskite structure are almost the same, and the (100) plane and the (001) plane cannot be distinguished from each other by the analysis by XRD. However, it can be confirmed by XRD analysis that the alignment film is aligned in at least any one of the planes.

The thickness of the piezoelectric film 15 is generally 200 nm or more, and it is, for example, 0.2 μm to 5 μm. However, it is preferably 1 μm or more.

The height difference of the surface unevenness of the piezoelectric film 15 is preferably 100 nm or less. The method of measuring the surface unevenness will be described in Examples described later: however, the height difference of the surface unevenness shall be the peak to valley (the PV value), which is the maximum unevenness difference. Here, the cycle of the surface unevenness is not a fine cycle such as in several tens of nm to several hundred nm, but a cycle having an order in terms of μm.

In a case where the PV value of the surface unevenness of the piezoelectric film 15 is 100 nm or less, the effect of improving the pressure resistance of the piezoelectric element and the effect of improving the drive stability can be enhanced. The PV value of the surface unevenness of the piezoelectric film 15 is more preferably 80 nm or less.

The height difference of the surface unevenness can be measured in a dynamic force mode (DFM) using a scanning probe microscope (SPM). In a case where the upper electrode layer 18 having a pattern formed on the piezoelectric film 15 is formed, the height difference of the surface unevenness can be measured on the surface of the piezoelectric film 15 where the upper electrode layer 18 is not formed and is exposed. Alternatively, the measurement can be carried out on the surface of the piezoelectric film 15 before the formation of the upper electrode layer 18.

The substrate 10 is not particularly limited, and examples thereof include substrates such as silicon, glass, stainless steel, yttrium-stabilized zirconia, alumina, sapphire, and silicon carbide. As the substrate 10, a laminated substrate having a SiO$_2$ oxide film formed on the surface of the silicon substrate, such as a thermal oxide film-attached silicon substrate, may be used.

The upper electrode layer 18 is paired with the lower electrode layer 12 and is an electrode for applying a voltage to the piezoelectric film 15. The main component of the upper electrode layer 18 is not particularly limited, and examples thereof include, in addition to the electrode material that is generally used in the semiconductor process, a conductive oxide such as indium tin oxide (ITO), LaNiO$_3$, or (SrRuO$_3$ (SRO), and a combination thereof.

The layer thickness of the upper electrode layer 18 is not particularly limited, and it is preferably about 50 nm to 300 nm and more preferably 100 nm to 300 nm.

In the piezoelectric laminate 5 and the piezoelectric element 1 according to the present embodiment, the lower electrode layer 12 includes a first layer 21 arranged in a state of being in contact with the substrate 10 and includes a second layer 22 arranged in a state of being in contact with the piezoelectric film 15, where the first layer 21 contains Ti or TiW as a main component, and the second layer 22 contains Ir as a main component. Ti and TiW have good adhesiveness to the substrate 10, and Ir has good adhesiveness to the piezoelectric film 15. As a result, interlayer peeling is suppressed, and long-term reliability is high. The lower electrode layer 12 may include another metal layer between the first layer 21 and the second layer 22. However, since Ir and TiW, or Ir and Ti have high adhesiveness, it is most preferable that the lower electrode layer 12 has a two-layer structure of the first layer 21 and the second layer 22.

In the piezoelectric laminate 5 and the piezoelectric element 1 according to the present embodiment, the Ir layer 22 which is the second layer 22 is a uniaxial alignment film aligned in the Ir (111) plane, where the half width at half maximum of an X-ray diffraction peak from the (111) plane of IR is 0.3° or more. As described above, the description that the half width at half maximum of the X-ray diffraction peak is 0.3° or more means that the crystallinity of the Ir layer 22 is slightly low, and sufficient alignment is not achieved in the (111) plane which is the preferential alignment plane. Further, in a case where the Ir (111) plane is disturbed, it is possible to suppress the growth of the pyrochlore phase at the time of the formation of the piezoelectric film 15 containing a perovskite-type oxide, where the piezoelectric film 15 is provided on the upper layer side. Since it is possible to sufficiently suppress the pyrochlore phase, it is possible to obtain the piezoelectric laminate 5 and the piezoelectric element 1, which have the piezoelectric film 15 containing a good perovskite-type oxide. Since the piezoelectric film 15 in which the pyrochlore phase is suppressed is provided, it is possible to obtain high piezoelectric characteristics, and it is possible to obtain higher drive stability as compared with the case of the related art.

Further, since the piezoelectric laminate 5 and the piezoelectric element 1 according to the present embodiment are obtained by directly laminating a piezoelectric film on the Ir layer 22 without providing a layer such as an alignment control layer, they can be manufactured without increasing the process load as in the case in the related art, where an alignment control layer is provided. As a result, it is possible to suppress an increase in manufacturing cost.

It is noted that in a case where the half width at half maximum of the X-ray diffraction peak from the Ir (111) plane of the Ir layer 22 is 0.35° or more, the effect of suppressing the growth of the pyrochlore phase can be further enhanced, and as a result, the piezoelectric characteristics and the drive stability can be further enhanced.

In a case where the half width at half maximum of the X-ray diffraction peak from the Ir (111) plane is 0.45° or less and preferably 0.4° or less, the growth of the pyrochlore phase can be suppressed while maintaining the resistance value of the Ir layer 22 and the adhesiveness to the piezoelectric film 15 at the same level as those of an Ir layer having high crystallinity.

In the piezoelectric laminate 5 and the piezoelectric element 1 according to the present embodiment, the Ir (111) plane of the Ir layer 22 which is the second layer has an inclination of 1° or more with respect to the thickness direction. This indicates that the aligning properties of the Ir (111) plane are disturbed, the half width at half maximum is 0.3° or more, and the crystallinity is also low. In a case where the aligning properties of the Ir (111) plane are slightly decreased, the effect of suppressing the pyrochlore phase can also be obtained.

In the piezoelectric laminate and the piezoelectric element 1 according to the present embodiment, it is preferable that the thickness t2 of the second layer 22 of the lower electrode layer 12, that is, that of the Ir layer 22 is 50 nm or less. In a case where the thickness t2 of the Ir layer 22 is set to 50 nm or less, the aligning properties of the Ir (111) plane can be decreased. The inventors of the present invention found that in a case where the thickness t2 of the Ir layer 22 is set to 75 nm or less, the half width at half maximum of the Ir (111) peak can be made to be 0.30° or more, and in a case where the thickness t2 of the Ir layer 22 is set to 50 nm or less, which is thin as compared with a case in the related art, the half width at half maximum of the Ir (111) peak can be made to be 0.35° or more. It is noted that the method of making the half width at half maximum of the Ir (111) peak 0.30° or more is not limited to a method of forming the Ir layer 22 to be thin as compared with a case in the related art, and it is also possible to use another method such as reducing the crystallinity of the first layer 21 which is the underlying layer of the Ir layer 22. Further, in a case where the thickness of the Ir layer 22 is set to 50 nm or less, the using amount of Ir can be reduced as compared with the case of the related art, and thus the material cost of the lower electrode layer 12 can be suppressed, whereby the suppression of the manufacturing cost can be achieved.

In a case where the thickness t of the lower electrode layer 12 is 200 nm or more, sufficient conductivity as the lower electrode layer 12 can be obtained. Further, in a case where the thickness t of the lower electrode layer 12 is 250 nm or more, it is possible to obtain still better conductivity. Although the Ir layer 22 is made thin as compared with a case in the related art, the sheet resistance can be decreased in a case where the first layer 21 is made to be thick to some extent and the thickness of the entire lower electrode layer 12 is made to be 200 nm or more.

It is noted that in a case where the sheet resistance of the lower electrode layer 12 is Ω/sq or less, it is suitable for applying a voltage to the piezoelectric film 15 by being paired with the upper electrode layer 18.

The piezoelectric film 15 contains a perovskite-type oxide; however, in a case where it contains particularly a perovskite-type oxide containing Pb, the pyrochlore phase is easily formed at the initial stage of film formation since Pb is easily removed. As a result, the effect of suppressing the pyrochlore phase due to the point that the half width at half maximum of the X-ray diffraction peak from the Ir (111) plane is 0.3° or more is particularly high. Among the perovskite-type oxides containing Pb, a PZT-based perovskite-type oxide containing Pb, Zr, Ti, and O has high piezoelectric characteristics and thus is particularly preferable. Still higher piezoelectric characteristics can be obtained particularly in a case where the perovskite-type oxide is a compound represented by General Formula (1), $$Pb\{(Zr_xTi_{1-x})_{1-y}B1_y\}O_3 \qquad (1)$$

where $0<x<1$ and $0<y<0.4$ are satisfied, and

B1 is one or more elements selected from V, Nb, Ta, Sb, Mo, and W.

The piezoelectric element 1 or the piezoelectric laminate 5 according to each of the above embodiments can be applied to an ultrasonic device, a mirror device, a sensor, a memory, and the like.

EXAMPLES

Hereinafter, specific examples and comparative examples of the piezoelectric element of the present disclosure will be described. First, a manufacturing method for a piezoelectric element of each example will be described. A radio frequency (RF) sputtering device was used for the film formation of each layer. It is noted that conditions other than the configuration of the lower electrode layer are common in each example. The description of the manufacturing method will be made with reference to the reference numerals of the respective layers of the piezoelectric element 1 illustrated in FIG. 1.

Film Formation of Lower Electrode Layer

As the substrate 10, a thermal oxide film-attached silicon substrate having a size of 8 inches was used. The lower electrode layer 12 was formed into a film on the substrate 10 by radio-frequency (RF) sputtering. Specifically, as the lower electrode layer 12, the TiW layer 21 as the first layer 21, and the Ir layer 22 as the second layer 22 were laminated in this order on the substrate 10. The thicknesses of the TiW layer 21 and the Ir layer 22 differ depending on each example and are as shown in Table 1. In addition, the sputter conditions for each layer were as follows.

Sputter Conditions for TiW Layer

Distance between target and substrate: 100 mm

Target input power: 600 W

Ar gas pressure: 0.5 Pa

Substrate set temperature: 350° C.

Sputter Conditions for Ir Layer

Distance between target and substrate: 100 mm

Target input power: 600 W

Ar gas pressure: 0.1 Pa

Substrate set temperature: 350° C.

Formation of Piezoelectric Film

The substrate 10 attached with the lower electrode layer 12 was placed in the inside of an RF sputtering device, and an Nb-doped PZT film of 2 μm was formed as the piezoelectric film 15, where the Nb-doping amount to the B site was set to 12 at %. The sputter conditions at this time were as follows.

Sputter Conditions for Piezoelectric Film

Distance between target and substrate: 60 mm

Target input power: 500 W

Vacuum degree: 0.3 Pa, an $Ar/O_2$ mixed atmosphere ($O_2$ volume fraction: 2.0%)

Substrate set temperature: 700° C.

Film Formation of Upper Electrode Layer

Next, the substrate 10 after forming the piezoelectric film 15 was placed in a film forming chamber of the RF sputtering device, and by using an indium tin oxide (ITO) target, an ITO layer was formed into a film having a thickness of 200 nm as the upper electrode layer 18. It is noted that before the film formation of the upper electrode layer 18, a lift-off pattern for an evaluation sample was prepared on the piezoelectric film 15, and the upper electrode layer 18 was formed on the lift-off pattern. The film forming conditions for the upper electrode layer 18 were as follows.

Sputter Conditions for Upper Electrode Layer

Distance between target and substrate: 100 mm

Target input power: 200 W

Vacuum degree: 0.3 Pa, an $Ar/O_2$ mixed gas (02 volume fraction: 5%)

Substrate set temperature: room temperature (RT)

Formation of Electrode Pattern for Evaluation

After the formation of the upper electrode layer 18, the upper electrode layer was lifted off along the lift-off pattern according to the lift-off method to carry out the pattering of the upper electrode layer 18.

Through the above steps, the piezoelectric laminated substrate of each example, having the lower electrode layer, the piezoelectric film, and the patterned upper electrode layer on the substrate, was produced.

Production of Evaluation Sample

Evaluation Sample 1

A strip-shaped portion of 2 mm×25 mm was cut out from the piezoelectric laminated substrate to prepare a cantilever as an evaluation sample 1.

Evaluation Sample 2

A portion of 25 mm×25 mm having, at the center of the surface of the piezoelectric film, an upper electrode layer that had been patterned in a circular shape having a diameter of 400 μm, was cut out from the piezoelectric laminated substrate and used as an evaluation sample 2.

Evaluation of Piezoelectric Characteristics

The piezoelectric constant $d_{31}$ was measured for the evaluation of the piezoelectric characteristics of each of Examples and Comparative Examples.

The piezoelectric element produced as described above was cut into a strip shape of 2 mm×25 mm to produce a cantilever. Then, according to the method described in I. Kanno et. al. Sensor and Actuator A 107 (2003) 68, the lower electrode layer 12 was grounded, and the measurement of the piezoelectric constant $d_{31}$ was carried out by applying a voltage of sine wave of −10 V±10 V to the upper electrode layer 18. The results are shown in Table 1.

Evaluation of Long-Term Reliability

A time dependent dielectric breakdown (TDDB) test was carried out for the evaluation of the long-term reliability of each of Examples and Comparative Examples. Using the evaluation sample 2, in an environment of 120° C., the lower electrode layer 12 was grounded, a voltage of −40 V was applied to the upper electrode layer 18, and the time (hr) taken from the start of the voltage application to the occurrence of dielectric breakdown was measured. The measurement results are shown in Table 1. It is noted that the TDDB test was carried out for 1,000 hours, and those in which dielectric breakdown did not occur up to 1,000 hours are described as 1,000 in Table 1.

Evaluation of Resistance Value

The resistivity (the sheet resistance) of the lower electrode layer 12 was measured with a dedicated four-point probe by using a low resistivity meter Loresta-AX. For each example, the resistivity was measured at the time when the lower electrode layer 12 was formed into a film on the substrate 10.

Evaluation of Crystallinity

The crystallinity of the piezoelectric film (the PZT film) and the crystallinity of the Ir layer of the lower electrode layer of the piezoelectric laminate of each example were evaluated by the XRD analysis using RINT-ULTIMA III manufactured by Rigaku Corporation.

Evaluation of Peak Intensity Derived from Pyrochlore Phase

Figure 5:
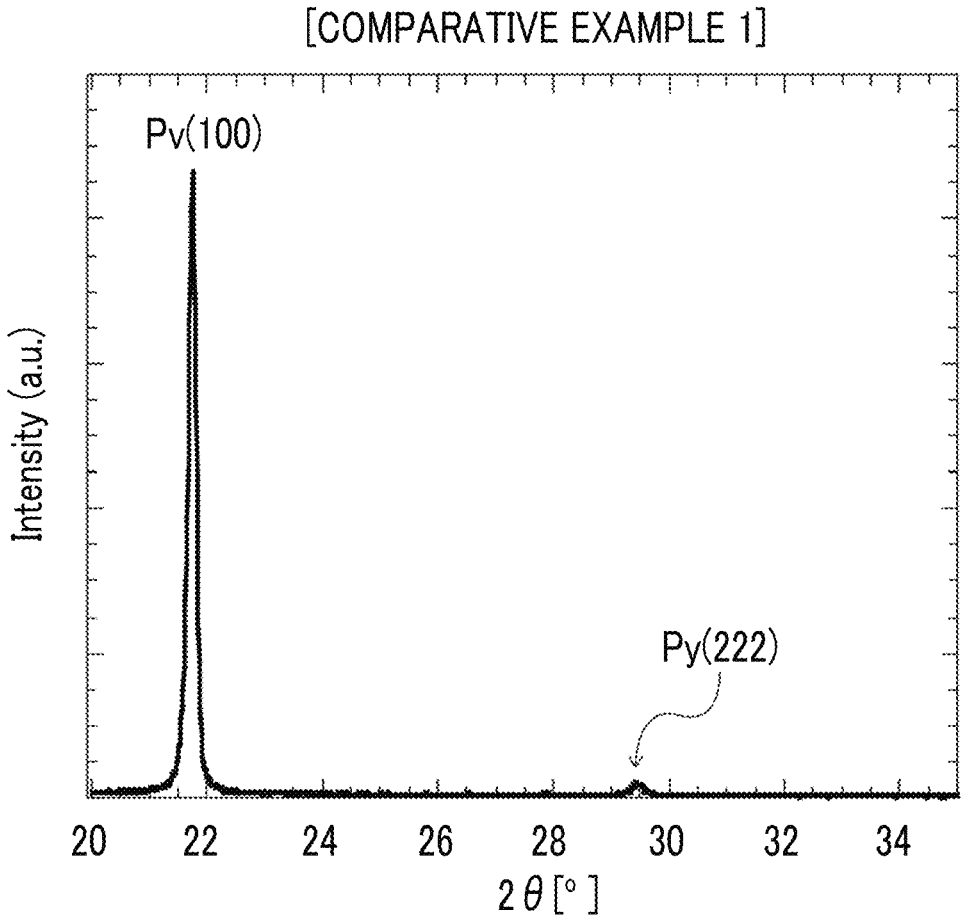
FIG. 5 is an XRD chart of Comparative Example 1.
Figure 6:
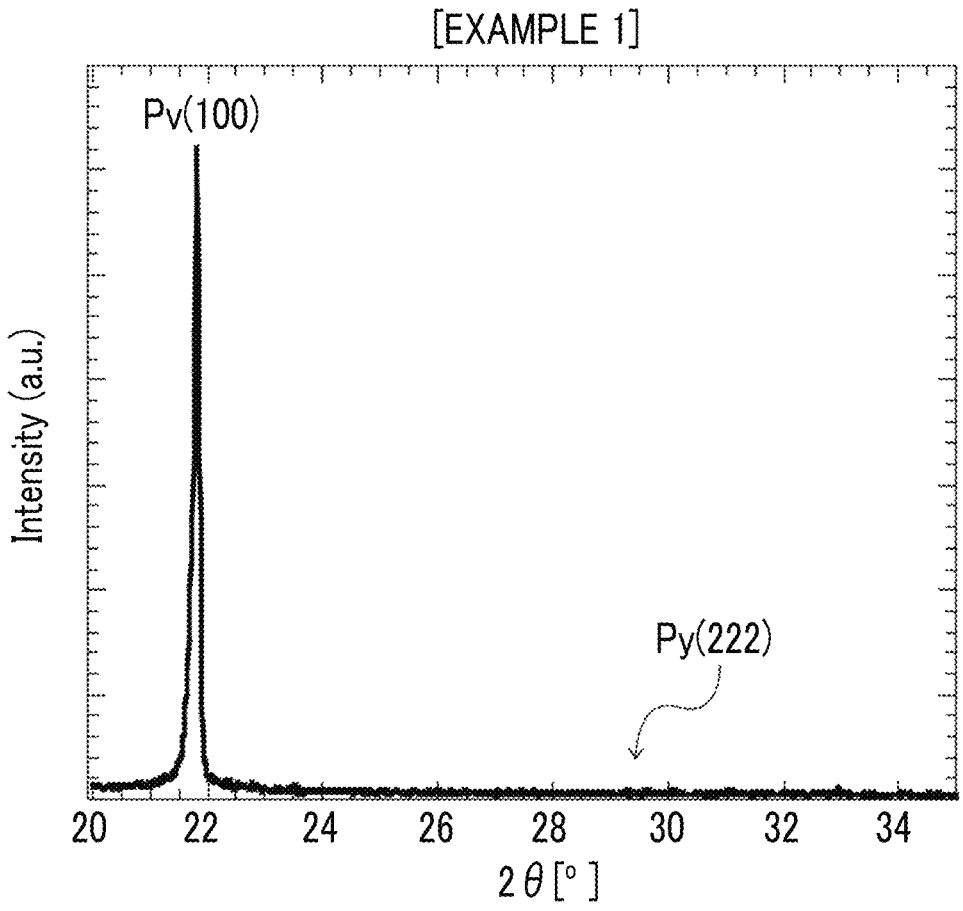
FIG. 6 is an XRD chart of Example 1.

FIG. 5 shows an XRD chart from Comparative Example 1, and FIG. 6 shows an XRD chart from Example 1. The evaluation of crystallinity was carried out using the piezoelectric laminate before the film formation of the upper electrode layer.

From the XRD chart obtained from each example, the intensity of the pyrochlore phase (222), which is a different phase, was determined. The region where the pyrochlore phase (222) was detected was in the vicinity of 29°, and the peak intensity derived from the pyrochlore phase (222) was adopted as a peak intensity obtained by removing the noise derived from the background, from the obtained XRD diffraction intensity (counts).

Further, from the XRD chart, py (222)/{pr (100)+pr (110)+pr (111)}1×100% was calculated as the pyrochlore rate.

The intensity from each plane was determined as follows.

The average value of the number of counts in a case where 2θ is 25° to 28° is defined as the noise N derived from the background.

The intensity of py (222) was defined as the value obtained by eliminating N from the maximum number of counts in a range in which 2θ was 28° to 30°.

The intensity of pr (100) was defined as the value obtained by eliminating N from the maximum number of counts in a range in which 2θ was 21° to 23°.

The intensity of pr (110) was defined as the value obtained by eliminating N from the maximum number of counts in a range in which 2θ was 30° to 32°.

The intensity of pr (111) was defined as the value obtained by eliminating N from the maximum number of counts in a range in which 2θ was 37.5° to 39.5°.

In FIG. 5 and FIG. 6, the peak values of the perovskite phase (100) are the same. On the other hand, there is a difference in the pyrochlore phase (222). As shown in FIG. 5, in Comparative Example 1, there is a clear peak of the pyrochlore phase (222) in the vicinity of 29°. In Example 1 shown in FIG. 6, the peak value of the pyrochlore phase (222) is decreased as compared with the case of Comparative Example 1. As shown in FIG. 6, in Example 1, a PZT film uniaxially aligned at (001) has been obtained. It is noted that in any one of Examples 2 to 4, a PZT film uniaxially aligned in the same manner as in Example 1 (001) has been obtained.

Half Width at Half Maximum of Ir (111) Peak

Figure 7:
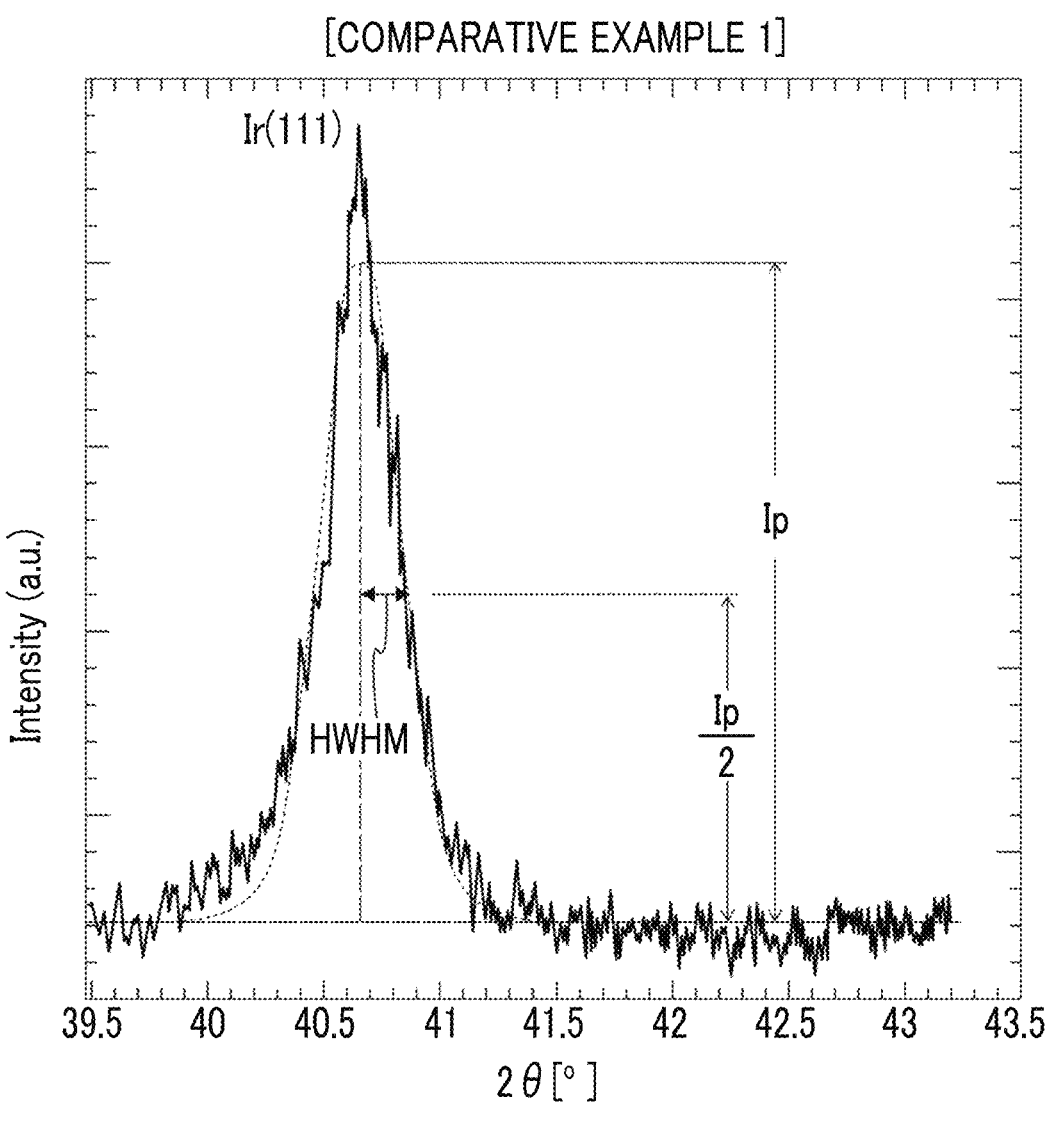
FIG. 7 is a graph showing an Ir (111) peak of Comparative Example 1.
Figure 8:
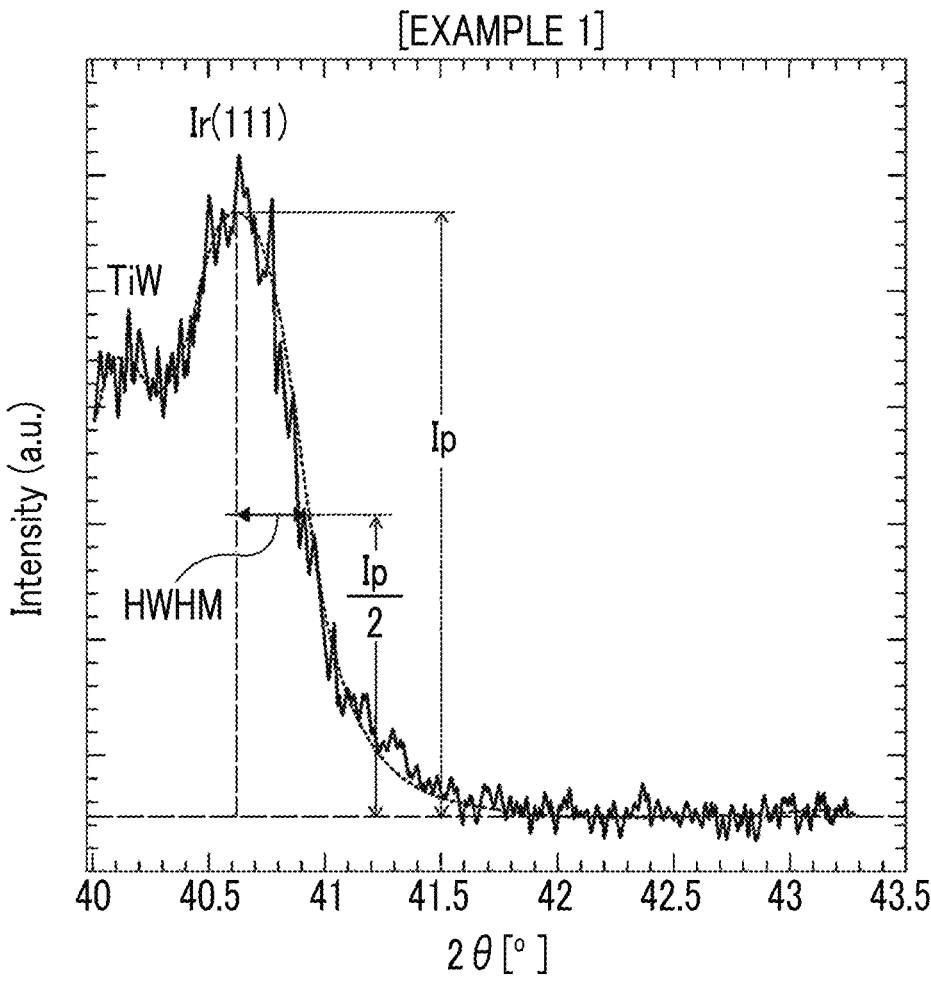
FIG. 8 is a graph showing an Ir (111) peak of Example 1.

From the XRD chart obtained from each example, the half width at half maximum of the Ir (111) peak was determined. The Ir (111) peak is generated in the vicinity of 40.7°. FIG. 7 is a graph in which the vicinity of the Ir (111) peak of the XRD chart of Comparative Example 1 is enlarged, and FIG. 8 is a graph in which the vicinity of the Ir (111) peak of the XRD chart of Example 1 is enlarged. The Ir (111) peak is generated in the vicinity of 2θ=40.7°. In Example 1 shown in FIG. 8, the peak of the TiW layer, which is the first layer of the lower electrode layer is adjacent, and thus peaks are partially overlapped with each other. It is noted that in Comparative Example 1, the peak of the TiW layer was hardly observed. Fitting was carried out on peaks using a double Gaussian function. In the fitting curve of the Ir (111) peak, the half width at half maximum (HWHM) was determined as a width between a 2θ value at which the maximum value Ip of the Ir (111) peak is shown and a 2θ value at which an intensity of ½ of the maximum value Ip is shown. The results are shown in Table 1.

Inclination of Ir (111) Plane of Lower Electrode Layer from Substrate Surface

Figure 9:
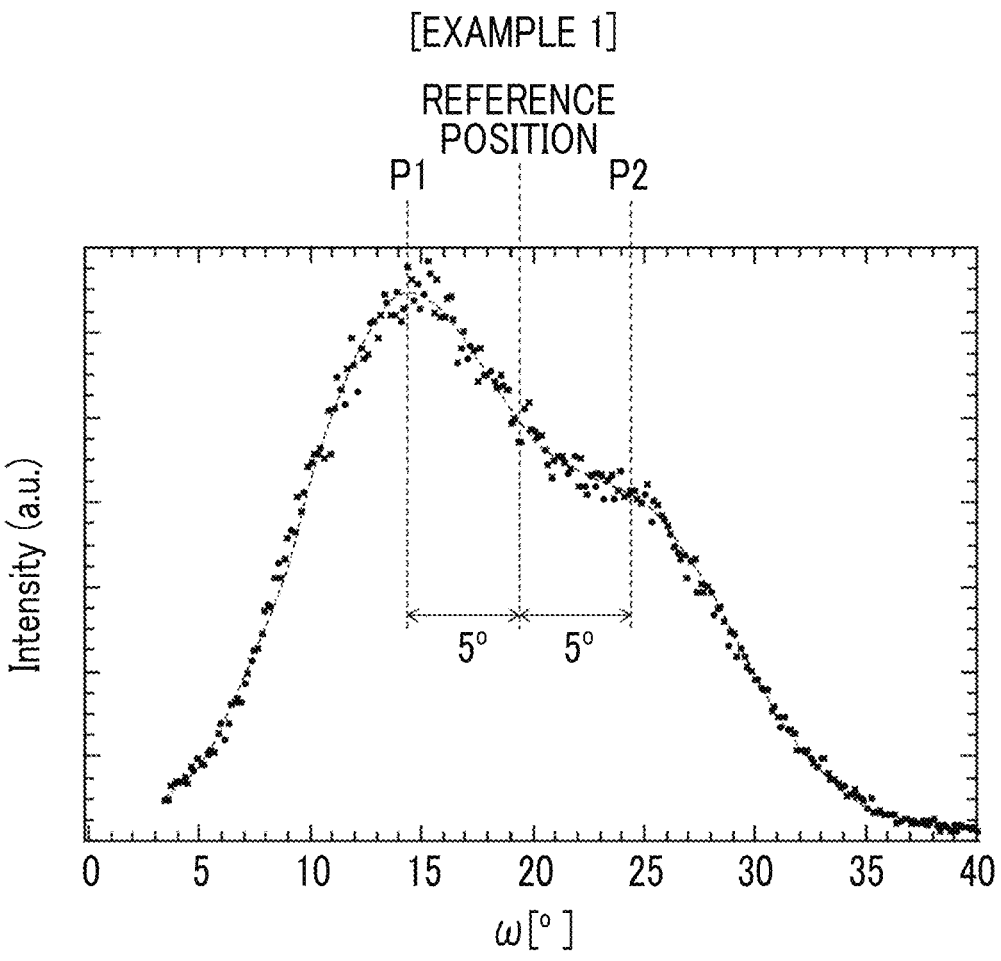
FIG. 9 is a graph showing Ir (111) locking curve measurement data of Example 1.

Regarding Examples and Comparative Examples, the sample before forming the upper electrode layer was used to evaluate the crystallinity of the first layer by XRD using RINT-ULTIMA III manufactured by Rigaku Corporation. Specifically, the inclination of the peak of the Ir (111) plane was determined, by the locking curve measurement, from the deviation of the position of the peak of the Ir (111) plane from that of the Ir peak in a case where the (111) plane was not inclined. FIG. 9 is the locking curve measurement data of Example 1. The reference position shown in the figure is a position of a peak of the (111) plane, where the peak appears in a case where the (111) plane is parallel to the surface of the substrate. The example shown in FIG. 9 has a first peak P1 and a second peak P2, and the split width therebetween is 10°. The center of the split width between the first peak P1 and the second peak P2 is the reference chlore phase is calculated from the number of pixels obtained from the image processing software and divided by the visual field width of the TEM image to obtain the average layer thickness. As the image processing software, Photoshop (registered trade name) was used here. Table 1 shows the thickness of the pyrochlore phase obtained as described above.

Measurement of Surface Unevenness of Piezoelectric Film

Surface unevenness was measured in a dynamic force mode (DFM) using an S-image type scanning probe microscope (SPM) manufactured by Hitachi High-Tech Science Corporation. The surface unevenness was measured within a range of 5 $\mu m^2$ on the surface of the piezoelectric film 15 where the circular upper electrode layer 18 was not formed and was exposed. The peak to valley (the PV value), which is the maximum unevenness difference on the surface, was about 80 mm, and there was substantially no difference in all of Comparative Examples and Examples.

TABLE 1

| | First layer Tiw thickness [nm] | Ir thickness [nm] | Half width at half maximum of (111) peak [°] | Inclinationα of (111) plane [°] | Resistivity [Ω/sq] | Thickness of pyrochlore phase [nm] | Pyrochlore rate [%] | Piezoelectric constant $d_{31}$ (pm/V) | Reliability test [hr] |
|---|---|---|---|---|---|---|---|---|---|
| | | | | Lower electrode layer | | | | | |
| | | | Second layer | | | | | | |
| Comparative Example 1 | 20 | 150 | 0.25 | 0 | 0.8 | 50 | 1.50 | 200 | 250 |
| Comparative Example 2 | 150 | 150 | 0.25 | 2 | 0.5 | 50 | 1.20 | 190 | 250 |
| Example 1 | 200 | 50 | 0.37 | 5 | 0.7 | 20 | 0.2 or less | 230 | 1000 |
| Example 2 | 150 | 50 | 0.35 | 5 | 0.8 | 20 | 0.2 or less | 220 | 1000 |
| Example 3 | 250 | 30 | 0.4 | 6 | 0.6 | 15 | 0.2 or less | 240 | 1000 |
| Example 4 | 300 | 30 | 0.4 | 6 | 0.6 | 15 | 0.2 or less | 240 | 1000 |
| Example 5 | 200 | 75 | 0.3 | 5 | 0.6 | 25 | 0.2 or less | 220 | 1000 | position, and in this example, it is meant that the (111) plane of the first layer is inclined by 5° with respect to a state where it is parallel to the substrate. The measured values for each example are shown in Table 1.

Evaluation of Pyrochlore Phase Thickness

Regarding Examples and Comparative Examples, transmission electron microscope (TEM) images were captured, and the thickness of the pyrochlore phase was determined from the TEM images. In the piezoelectric film, the contrast in the TEM image differs between the pyrochlore phase and the perovskite phase, and thus it is possible to specify the region of the pyrochlore phase and calculate the thickness thereof. It is noted that it was observed that columnar crystal bodies of the perovskite-type oxide were formed in the portion of the piezoelectric film other than the pyrochlore phase. The thickness of the pyrochlore phase was calculated as an average thickness since the pyrochlore phase was not uniformly formed on the surface of the lower electrode layer.

Specifically, the contrast adjustment function of the image processing software is used to binarize the original image at a predetermined threshold value, and the edge extraction function of the image processing software is used to extract the pyrochlore phase. In this case, the threshold value is such that noise is removed as much as possible and only those that can be clearly distinguished from the pyrochlore phase are extracted. In a case where the outline of the pyrochlore-type oxide layer is unclear in the binarized image, the outline is empirically drawn while looking at the binarized image, and the inside thereof is filled. The area of the extracted pyro- As shown in Table 1, the following results were obtained that in a case where the half width at half maximum of the Ir (111) peak is 0.3 or more as in Examples 1 to 5, the pyrochlore phase is suppressed as compared with Comparative Examples 1 and 2 in which the half width is less than 0.3°, the piezoelectric characteristics and long-term reliability are high. In particular, the effect of improving long-term reliability is remarkable. In a case where the thickness of the Ir layer is set to 75 nm, the half width of the Ir (111) peak can be made to be 0.3° or more, and in a case where the thickness of the Ir layer is set to 50 nm or less, the half width at half maximum of the Ir (111) peak can be made to be 0.35° or more. It can be seen that there is a tendency that the half-value width of the Ir (111) peak can be increased as the Ir layer becomes thinner. Further, as the Ir (111) peak is larger, the thickness of the pyrochlore phase can be reduced, and the piezoelectric constant can be increased. Further, from Examples 1 to 5, it can be seen that in a case where the thickness of the lower electrode layer is 200 nm or more, the sheet resistivity as the lower electrode layer can be suppressed to 1 Ω/sq or less even in a case where the thickness of the Ir layer is suppressed to 50 nm or less.

What is claimed is:

1. A piezoelectric laminate comprising, on a substrate in the following order:
   a lower electrode layer; and
   a piezoelectric film containing a perovskite-type oxide,
   wherein the lower electrode layer includes a first layer
   arranged in a state of being in contact with the substrate and includes a second layer arranged in a state of being in contact with the piezoelectric film, the first layer contains Ti or TiW as a main component, the second layer is a uniaxial alignment film which contains Ir as a main component and in which the Ir is aligned in a (111) plane, and a half width at half maximum of an X-ray diffraction peak from the (111) plane is from 0.3° to 0.45°.

2. The piezoelectric laminate according to claim 1, wherein the half width at half maximum of the X-ray diffraction peak from the (111) plane is 0.35° to 0.45°.

3. The piezoelectric laminate according to claim 1, wherein in the second layer, the (111) plane has an inclination of 1° or more with respect to a thickness direction.

4. The piezoelectric laminate according to claim 1, wherein a thickness of the second layer is 50 nm or less.

5. The piezoelectric laminate according to claim 4, wherein a thickness of the lower electrode layer is 200 nm or more.

6. The piezoelectric laminate according to claim 1, wherein a sheet resistance of the lower electrode layer is 1 Ω/sq or less.

7. The piezoelectric laminate according to claim 1, wherein a height difference of a surface unevenness of the piezoelectric film is 100 nm or less.

8. The piezoelectric laminate according to claim 1, wherein the perovskite-type oxide contains Pb, Zr, Ti, and O.

9. The piezoelectric laminate according to claim 8, wherein the perovskite-type oxide is a compound represented by General Formula (1), $$Pb\{(Zr_xTi_{1-x})_{1-y}B1_y\}O_3 \tag{1}$$

$0<x<1$, $0<y<0.4$, and

B1 is one or more elements selected from V, Nb, Ta, Sb, Mo, and W.

10. The piezoelectric laminate according to claim 1, wherein the piezoelectric film has a columnar structure consisting of a large number of columnar crystals.

11. The piezoelectric laminate according to claim 10, wherein a (100) or (001) plane of the columnar crystals has an inclination of 1° or more with respect to a surface of the substrate.

12. A piezoelectric element comprising:

the piezoelectric laminate according to claim 1; and an upper electrode layer provided on the piezoelectric film of the piezoelectric laminate.

* * * * *